(12) United States Patent
Gilton (10) Patent No.: US 7,011,984 B2
(45) Date of Patent: *Mar. 14, 2006

(54) METHODS OF FORMING SWITCHABLE CIRCUIT DEVICES

(75) Inventor: Terry L. Gilton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/056,483

(22) Filed: Feb. 11, 2005

(65) Prior Publication Data

US 2005/0145834 A1 Jul. 7, 2005

Related U.S. Application Data

(62) Division of application No. 10/695,961, filed on Oct. 27, 2003, now Pat. No. 6,956,231, which is a division of application No. 10/177,242, filed on Jun. 21, 2002, now Pat. No. 6,713,339.

(51) Int. Cl.
G11C 11/00 (2006.01)

(52) U.S. Cl. .......................... 438/99; 365/151; 365/153

(58) Field of Classification Search ................ 257/1–5, 257/E45.002, E47.005; 438/900, 131, 132, 438/139, 467, 99; 365/151, 153, 158
See application file for complete search history.

(56) References Cited

U.S. PATENT DOCUMENTS

| 6,087,674 A | 7/2000 | Ovshinsky et al. ............ 257/2 |
| 6,187,604 B1 | 2/2001 | Gilton ......................... 438/20 |
| 6,238,974 B1 | 5/2001 | Chern et al. ................. 438/255 |
| 6,756,296 B1 | 6/2004 | Collier et al. ............... 438/622 |

OTHER PUBLICATIONS

A. Bsiesy et al., "Anodic Oxidation of Porous Silicon Layers Formed on Lightly p-Doped Substrates", J. Electrochem. Soc., vol. 138, No. 11, Nov. 1991, p. 3450-3456.

Yoshinobu Arita et al., "Formation and Properties of Porous Silicon Film", Journal of the Electrochem. Soc., vol. 124, No. 2, Feb. 1977, p. 284-295.

Dagani, R., "Building from the Bottom Up"; Nano Technology, Oct. 16, 2000, p. 25, 27-32.

Jacoby, M., "New Tools for Tiny Jobs", Nano Technology, Oct. 16, 2000, p. 33-35.

Thayer, A.M., "Firms Find a New Field of Dreams", Nano Technology, Oct. 16, 2000, p. 36-38.

Schulz, W., "Crafting a National Nannotechnology Effort", Nano Technology, Oct. 16, 2000, p. 39-42.

Schultze, J. W., et al, "Regular Nanostructured System Formed Electrochemically: Deposition of Electroactive Polybihiophene into Porous Silicon", Electrochimica Acta, vol. 40, No. 10, 1995 p. 1369-1383.

Primary Examiner—Tom Thomas
Assistant Examiner—Matthew Landau
(74) Attorney, Agent, or Firm—Wells St. John P.S.

(57) ABSTRACT

The invention includes a switchable circuit device. The device comprises a first conductive layer and a porous silicon matrix over the first conductive layer. A material is dispersed within pores of the porous silicon matrix, and the material has two stable states. A second conductive layer is formed over the porous silicon matrix. A current flow between the first and second conductive layers is influenced by which of the stable states the material is in.

24 Claims, 7 Drawing Sheets

METHODS OF FORMING SWITCHABLE CIRCUIT DEVICES

RELATED PATENT DATA

This patent resulted from a divisional application of U.S. patent application Ser. No. 10/695,961, now U.S. Pat. No. 6,956,231, which was filed Oct. 27, 2003, which in turn resulted from a divisional application of U.S. patent application Ser. No. 10/177,242, which was filed Jun. 21, 2002, and is now U.S. Pat. No. 6,713,339.

TECHNICAL FIELD

The invention pertains to switchable circuit devices, and methods of forming switchable devices. In particular applications, the invention pertains to semiconductor constructions comprising switchable circuit devices.

BACKGROUND OF THE INVENTION

Various molecular switches have been developed within the past several years. The molecular switches are characterized by having two stable states which can be interchanged with one another. Exemplary molecular switches include redox-active catenanes, redox-active rotaxanes, and redox-active pseudorotaxanes. The molecular switches can be, for example, materials which can be interchanged between two stable states by oxidation and reduction. The oxidation and reduction of a material can be accomplished by, for example, altering a voltage that the material is exposed to.

In referring to this disclosure and the claims which follow a preferred exemplary switchable material is referred to as a "molecular switchable memory material", with the term "memory" emphasizing that the material has at least two stable and interchangeable states. It is possible that a memory material can have more than two stable states, but generally it is preferred that the material have only two stable states accessible in the particular environment that the material is utilized in. For instance, a material having multiple stable states accessible through redox reactions can be utilized in an environment wherein a voltage to the material is controlled such that only two of the stable states are accessed during utilization of the material as an active molecular switch.

In theory, the molecular switches can be incorporated into switchable circuit devices. Specifically, one of the stable states of a molecular switch can be referred to as a "1" digital state, and the other stable state can be referred to as a "0". Accordingly, a circuit device comprising a molecular switch material can be switchable between a first state corresponding to the "0" and a second state corresponding to the "1". The two states can be utilized for storing memory bits. Additionally, and/or alternatively, one of the stable states of a switchable molecular material can be referred to as an "on state" and the other as an "off state," and the material can be utilized to control electrical flow within a circuit. Specifically, when the material is in the "on state" electrical flow can proceed through the circuit, and when the material is switched to the "off state", electrical flow can be stopped within the circuit.

Various difficulties are encountered in attempting to incorporate switchable molecular materials into working circuits. Among the difficulties is that the switchable molecular material can be destroyed when incorporated into the circuit, and accordingly will no longer act as a molecular switch. For purposes of interpreting this disclosure and the claims that follow, an "active" molecular switch is defined as a molecule which retains an ability to switch from one stable state to another.

It would be desirable to develop new circuit structures incorporating molecular switches, and to develop new methods of forming circuit structures comprising molecular switches.

SUMMARY OF THE INVENTION

In one aspect, the invention encompasses a method of forming a switchable circuit device. A mass is formed over a substrate, and while the mass is over the substrate pores are formed within the mass to convert the mass to a porous matrix. An active molecular switchable memory material is provided within the pores of the porous matrix. An electrical connection is formed to the porous matrix.

In another aspect, the invention encompasses a method wherein a first conductive wiring layer is formed to be supported by semiconductor substrate. Porous silicon is formed over the conductive wiring layer, and an active molecular switchable memory material is formed within pores of the porous silicon. A second conductive wiring layer is formed over the porous silicon.

In one aspect, the invention encompasses a switchable circuit device comprising a porous silicon matrix and an active molecular switchable memory material within the porous silicon matrix.

In one aspect, the invention encompasses a switchable circuit device comprising a first conductive layer and a porous silicon matrix over the first conductive layer. A material is dispersed within pores of the porous silicon matrix, and the material has two stable states. A second conductive layer is formed over the porous silicon matrix. A current flow between the first and second conductive layers is influenced by which of the stable states the material is in.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
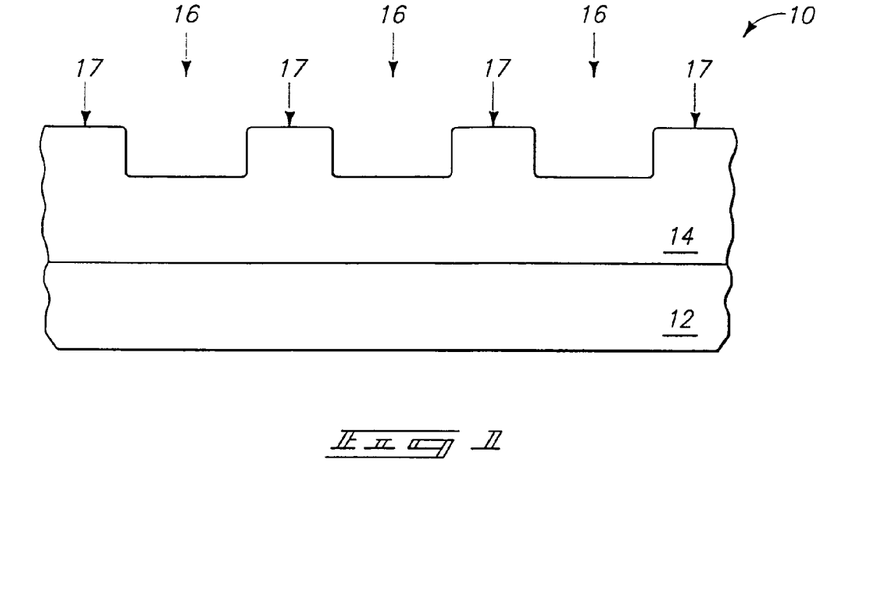
FIG. 1 is a diagrammatic, cross-sectional view of a fragment of a construction at a preliminary processing stage of a method in accordance with one aspect of the present invention.

An exemplary aspect of the invention is described with reference to FIGS. 1–7. Referring initially to FIG. 1, a construction 10 is illustrated at a preliminary processing stage. Construction 10 comprises a substrate 12 having an electrically insulative material 14 thereover. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Various circuit components (not shown) can be associated with substrate 12. Such components can be, for example, formed over a monocrystalline silicon mass and under the insulative material 14. Accordingly, substrate 12 can comprise numerous materials and structures which are not shown in the diagram of FIG. 1.

Insulative material 14 can comprise, for example, borophosphosilicate glass. A series of trenches 16 extend into insulative material 14. Trenches 16 can be formed by conventional processing, such as, for example, methods utilizing photolithographic processing. Insulative material 14 has an uppermost surface 17 extending between trenches 16.

Figure 2:
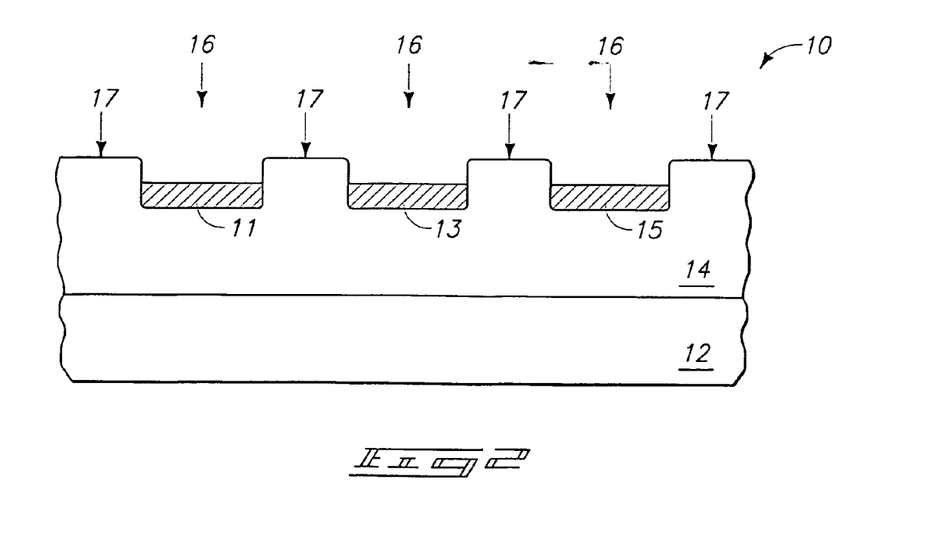
FIG. 2 is a view of the FIG. 1 fragment shown at a processing stage subsequent to that of FIG. 1.

Referring to FIG. 2, a conductive material is formed within trenches 16 to form wiring layers 11, 13 and 15. In particular embodiments, trenches 16 extend into and out of the page containing FIG. 2, and accordingly the wiring layers extend along the direction which is into and out of the page. The conductive material utilized in layers 11, 13 and 15 can be referred to as a first conductive wiring layer. Wiring layers 11, 13 and 15 can comprise any suitable conductive material, and in particular applications will comprise conductively-doped silicon, such as, for example, silicon which is doped to a concentration of at least about $1 \times 10^{20}$ atoms/cm$^3$ with a suitable dopant material. It can be preferred to utilize an n-type dopant in particular aspects of the invention. If wiring layers 11, 13 and 15 comprise conductively-doped silicon, the silicon can be, for example, one or both of amorphous and polycrystalline in physical character.

Wiring layers 11, 13 and 15 can be formed within trenches 16 by various processes. An exemplary process is to form a conductive material over upper surface 17 of insulative material 14, as well as within trenches 16; and to subsequently remove the material from over upper surface 17, as well as from within upper portions of trenches 16, with a suitable etch. Although conductive material of layers 11, 13 and 15 is shown only partially filling trenches 16, it is to be understood that the invention encompasses other aspects (not shown) in which the conductive material completely fills trenches 16.

Figure 3:
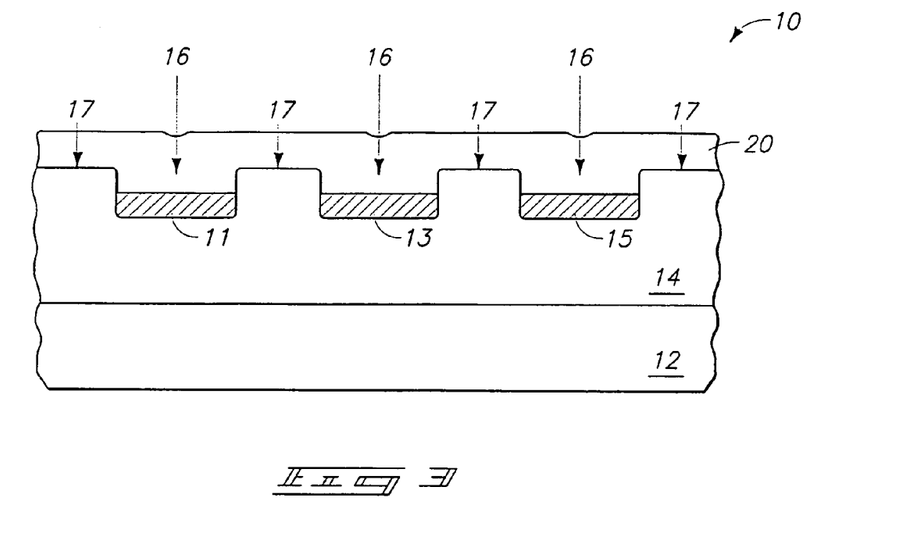
FIG. 3 is a view of the FIG. 1 fragment shown at a processing stage subsequent to that of FIG. 2.

Referring to FIG. 3, a mass 20 is formed over insulative material 14 and within trenches 16. Mass 20 can comprise, for example, silicon, and in particular aspects will consist essentially of silicon, or consist of silicon having one or more dopant materials dispersed therein. The type of silicon utilized within mass 20 can be, for example, either amorphous, or polycrystalline. It can be preferred that mass 20 comprise silicon doped with p-type material, such as, for example, boron.

Figure 4:
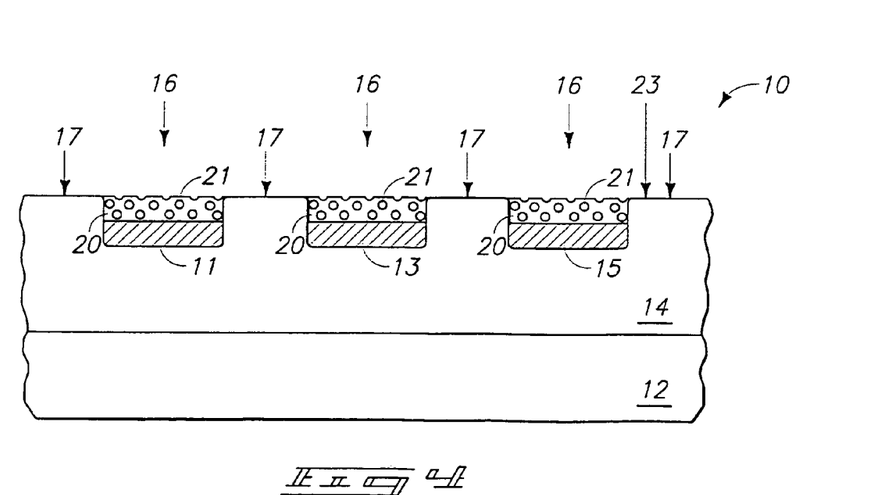
FIG. 4 is a view of the FIG. 1 fragment shown at a processing stage subsequent to that of FIG. 3.

Referring to FIG. 4, mass 20 is removed from over uppermost surfaces 17 of insulative material 14, to leave portions of the mass remaining within trenches 16. The remaining mass has pores 21 (only some of which are labeled) formed therein.

Mass 20 can be removed from over uppermost surfaces 17 of insulative material 14 by, for example, chemical-mechanical polishing. Such forms a planarized upper surface 23 which extends across uppermost remaining surfaces of insulative material 14 and mass 20. It is noted that pores 21 can extend into the planarized surface 23, and accordingly roughen portions of the surface extending across the remaining material 20. However, the surface 23 can still be considered to be generally planar across uppermost expanses of both insulative mass 14 and remaining material 20. It is further noted that if material 20 is removed from over an uppermost surface of mass 14 by chemical-mechanical planarization, such can remove some of the uppermost surface of material 14. Accordingly, the uppermost surface 17 of FIG. 4 may be at a reduced elevational level relative to the uppermost surface 17 shown in FIG. 3.

Pores 21 can be formed by, for example, exposing a silicon-containing mass 20 to hydrochloric acid during electrochemical anodization, as discussed in, for example, U.S. Pat. No. 6,187,604. Such anodization can selectively form pores within p-type doped silicon relative to n-type doped silicon. Accordingly, if both mass 20 and the conductive layer of lines 11, 13 and 15 comprise conductively-doped silicon, it can be preferred that mass 20 comprise p-type doped silicon and the conductive lines comprise n-type doped silicon. Accordingly, pores 21 will be selectively formed within mass 20 relative to the conductive lines 11, 13 and 15.

The formation of pores 21 within mass 20 converts mass 20 to a porous matrix, and the formation of pores 21 can occur either before or after removal of mass 20 from over an upper surface of insulative material 14.

Although silicon can be used as an exemplary material 20, it is to be understood that material 20 can comprise other components either alternatively to, or in addition to, silicon. Suitable components are, for example, those which enable a porous matrix to be formed over the conductive material of wiring layers 11, 13 and 15. Particularly suitable materials can be those which enable the porous matrix to be formed within a trench 16 to create a structure analogous to that shown in FIG. 4.

Figure 5:
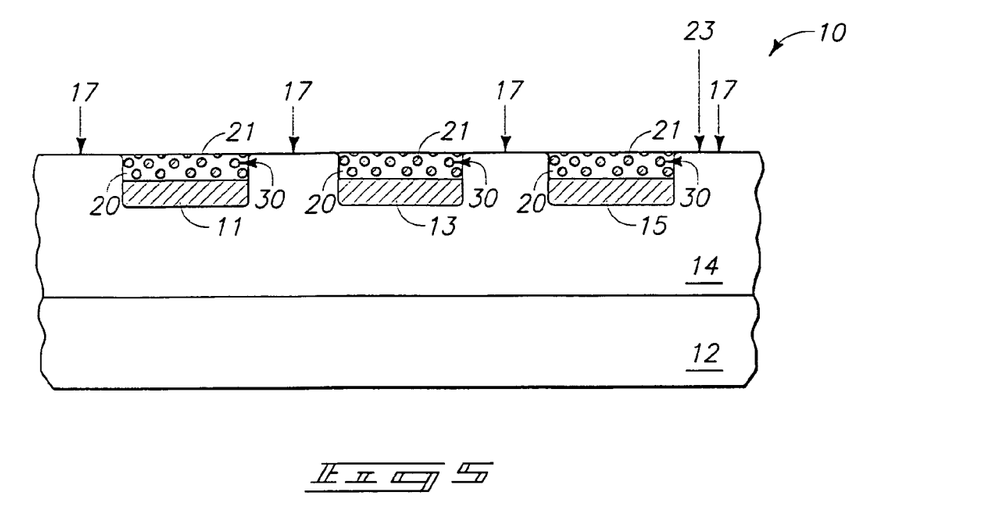
FIG. 5 is a view of the FIG. 1 fragment shown at a processing stage subsequent to that of FIG. 4.

Referring to FIG. 5, a molecular switchable material 30 is provided within pores 21 of the porous matrix 20. The molecular switchable material can partially fill, or entirely fill, the pores in a finished construction comprising the material within the pores. In a partial fill, by way of example only, the switchable material might only coat sidewall portions of the pores. The molecular switchable material is preferably an "active" molecular switchable memory material as formed within the pores 30. For purposes of interpreting this disclosure and the claims which follow, an "active" molecular switchable memory material is defined as a material which is in a proper form and environment to switch between at least two stable states. A material may be, by way of example, initially deposited in an inactive form, and then converted to an active form by chemically modifying the material and/or by altering electrical or other properties of an environment around the material. Suitable molecular switchable memory materials include, for example, redox-active catenanes, redox-active rotaxanes, and redox-active pseudorotaxanes.

The active molecular switchable memory material can be provided within pores 21 by the following exemplary process. Initially, a mixture is formed comprising active molecular switchable memory material within a liquid carrier. Such mixture is provided within the pores 21 of porous matrix material 20. Subsequently, at least some of the carrier is volatilized from the pores to leave the active molecular switchable memory material remaining within the cores. It can be preferred that all of the carrier is volatilized from within the pores. Volatilization of the carrier from pores 21 can be enhanced by one or more of reducing a pressure within the pores (for example, placing construction 10 within a vacuum chamber), flowing a purge gas across construction 10, or heating construction 10.

The mixture of active molecular switchable material and liquid carrier can be initially provided within pores 21 by, for example, dipping construction 10 into a vat of the mixture, spraying the mixture across a surface of construction 10, and/or other processes whereby the mixture is applied to porous matrix material 20.

Figure 6:
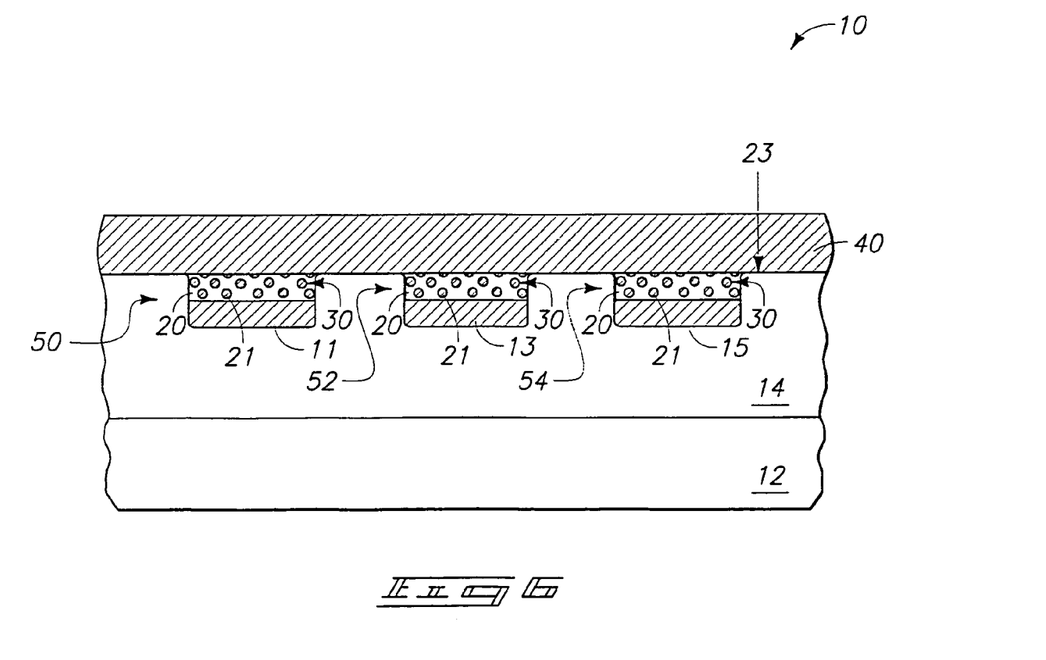
FIG. 6 is a view of the FIG. 1 fragment shown at a processing stage subsequent to that of FIG. 5.

Referring to FIG. 6, a wiring layer 40 is formed over porous matrix material 20 and the molecular switchable material 30 within the pores of porous matrix 20. Wiring layer 40 can comprise any suitable electrically conductive material, including, for example, metals and/or conductively-doped silicon.

Conductive wiring layer 40 is formed across planarized upper surface 23. Accordingly, in the shown aspect of the invention porous matrix 20 physically contacts the wiring layers 11, 13 and 15 beneath the matrix and the wiring layer 40 above the matrix. The wiring lines at the top and bottom of the porous matrix material 20 can be considered to form electrical connections to the porous matrix material having the switchable memory material therein.

Porous matrix material 20 can be considered to comprise a pair of opposing sides, with one of the sides being a bottom side and the other being a top side. Conductive lines 11, 13 and 15 can considered to be along the bottom side of matrix material 20; and conductive line 40 can be considered to be along the top side of the matrix material. In operation, current flow between conductive lines on the top and bottom sides of the matrix material 20 goes through the switchable memory material 30. Preferably, if matrix material 20 comprises doped silicon, a dopant level within matrix material 20 is low enough so that the matrix of material 20 does not form an electrically conductive connection between lines on opposing sides of material 20.

Molecular switchable material 30 will preferably have at least two stable states, and the current flow between lines on the top and bottom of matrix material 20 will preferably depend on which of the stable states that the switchable material is in. In particular applications, the switchable material can have only two stable states that are accessible under the conditions in which the molecular switchable material is utilized. The states can be referred to as a "0", and "1" digit state. Accordingly, current flow between lines on opposing sides of matrix material 20 can be utilized to determine which of the two stable states the molecular switchable material 30 is in. Additionally, if the molecular switchable material 30 comprises a material in which the two stable states can be interchanged by oxidation and reduction of the material, it is possible that the two stable states can be interchanged by changing a voltage that the material is exposed to. Accordingly, a state within material 30 can be selected by applying a particular voltage to material 30, and the state can subsequently be determined by measuring current flow between lines on opposing sides of matrix material 20.

In a particular aspect of the invention, the material 30 between lines 11 and 14 can be considered to be comprised by a first memory cell 50, the material 30 between line 13 and line 40 can be considered to be comprised by a second memory cell 52, and the material 30 between line 15 and line 40 can be considered to be comprised by a third memory cell 54. The construction of FIG. 6 can thus be utilized in forming memory devices, with information being written to material 30 by controlling a voltage relative to individual memory devices, and with information being read from material 30 by ascertaining current flow between a conductive line (11, 13 or 15) and line 40 relative to a particular device.

Figure 7:
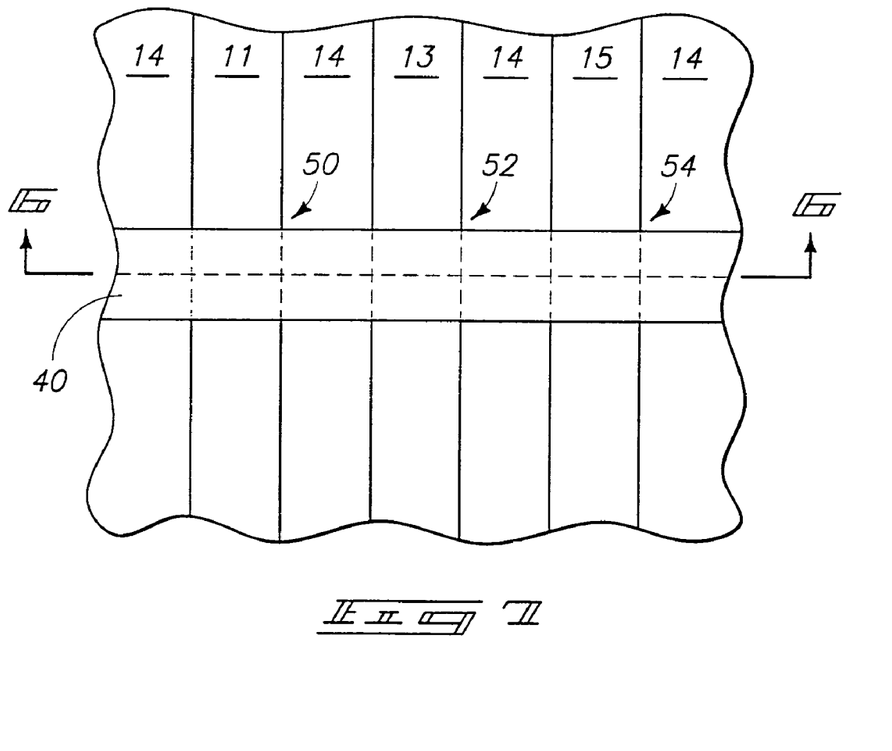
FIG. 7 is a top view of the construction of FIG. 6.

FIG. 7 illustrates a top views of the FIG. 6 construction. Such shows conductive lines 11, 13 and 15 extending substantially parallel to one another, and along a first general direction; and further shows conductive line 40 extending along a second direction which is substantially perpendicular to the direction of lines 11, 13 and 15. The second direction is referred to as being "substantially" perpendicular to indicate that the line is perpendicular within errors of fabrication and measurement. The memory cells 50, 52 and 54 described above with reference to FIG. 6 occur at intersections of lines 11, 13 and 14, respectively, with line 40. The lines 11, 13 and 15 are illustrated in phantom view underlying 40 to illustrate the locations of the memory cells. The memory cells can be considered to be part of an array.

Methodology described herein can have numerous applications. FIGS. 6 and 7 illustrate an exemplary application wherein the methodology is utilized to form memory cells. In other applications, the molecular switchable material 30 can be utilized in forming an on/off switch. For instance the material 30 shown in FIG. 6 between lines 15 and 40 can comprise a material which has a first state that allows current flow between lines 15 and 40, and a second state which substantially stops current flow between lines 15 and 40. Accordingly, the material can be set in the first state when current flow is desired between lines 15 and 40, and can then be switched to the second state to effectively turn off current flow between lines 15 and 40. Although the "on" and "off" states can be assigned digit values of 0 and 1, and accordingly the material 30 could be utilized in the memory device, there are numerous other applications for utilizing an on/off switch for which methodology of the present invention can be suitable.

Figure 8:
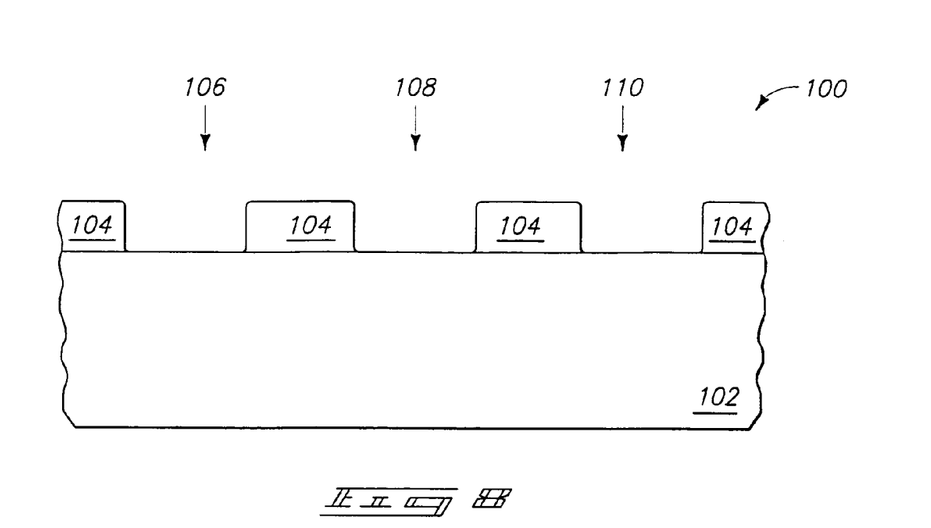
FIG. 8 is a diagrammatic, cross-sectional view of a fragment of a construction at a preliminary processing stage of a second embodiment method of the present invention.

A second embodiment method of the present invention is described with reference to FIGS. 8–12. Referring initially to FIG. 8, a fragment of a construction 100 is illustrated. Construction 100 includes a semiconductive material substrate 102 having a patterned mask 104 thereover. Substrate 102 can comprise, for example, monocrystalline silicon. Patterned mask 104 can comprise, for example, photoresist, and can be patterned utilizing photolithograpohic processing.

A series of openings 106, 108 and 110 extend through mask 104 and to substrate 102.

Figure 9:
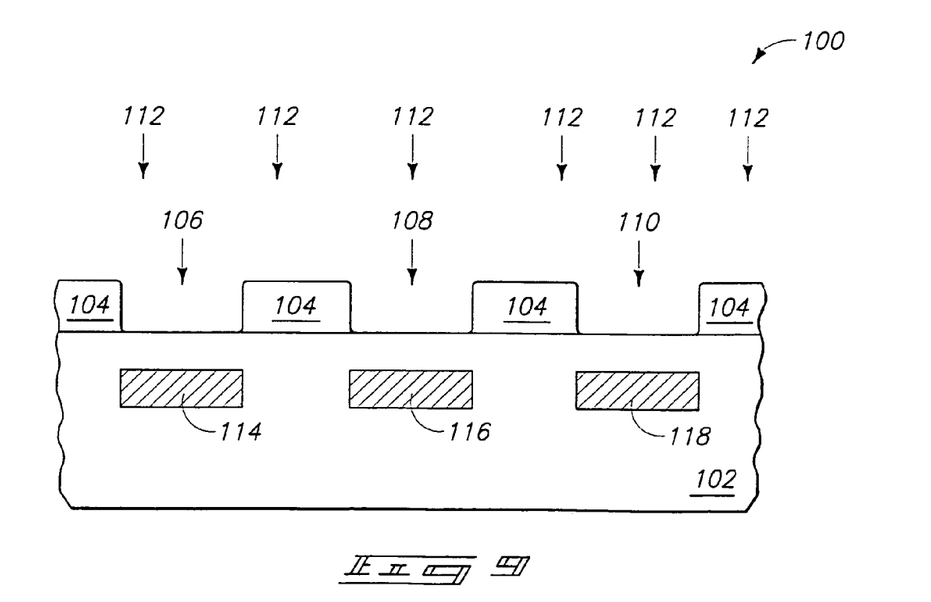
FIG. 9 is a view of the FIG. 8 fragment shown at a processing stage subsequent to that of FIG. 8.

Referring to FIG. 9, a dopant 112 is implanted through openings 106, 108 and 110, and into substrate 102 to form conductively-doped regions 114, 116 and 1418. Dopant 112 is preferably an n-type dopant (such as, for example, arsenic or phosphorous), and is preferably implanted into substrate 102 to a depth such that an upper surface of conductively-doped regions 114, 116 and 118 is below an uppermost surface of substrate 102, as shown. Conductively-doped regions 114, 116 and 118 can be formed as lines extending into and out of the page, and accordingly can constitute wiring layers extending within substrate 102. In particular aspects, conductively-doped regions 114, 116 and 118 can be considered conductive wiring layers supported by substrate 102.

Figure 10:
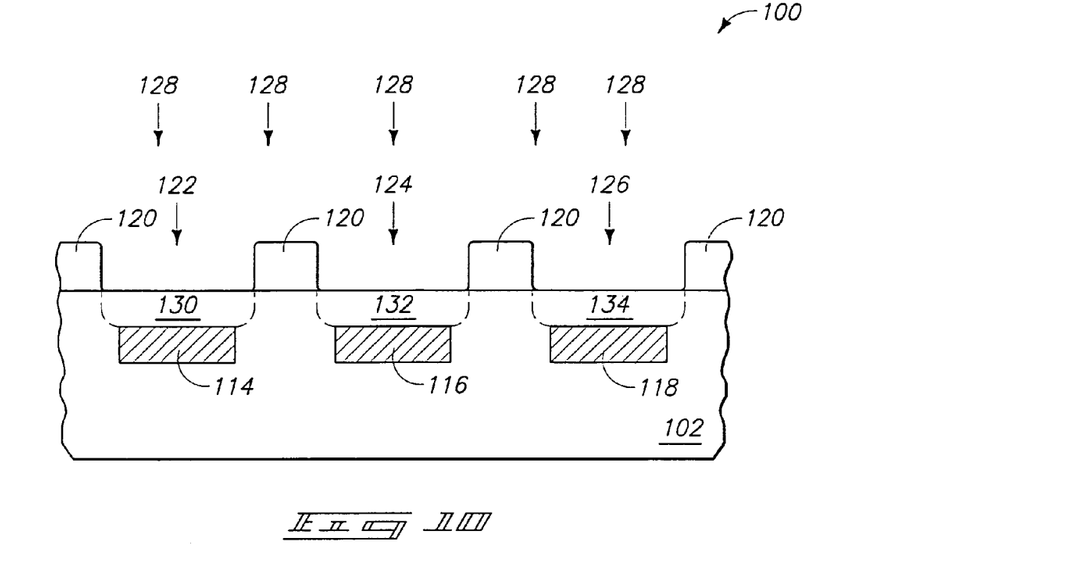
FIG. 10 is a view of the FIG. 8 fragment shown at a processing stage subsequent to that of FIG. 9.

Referring to FIG. 10, masking layer 104 (FIG. 9) is replaced by a masking layer 120 which defines openings 122, 124 and 126 overlapping the previous locations of openings 106, 108 and 110, respectively (FIG. 9). Masking layer 120 can be formed by reducing a lateral size of previous masking layer 104, or by entirely removing masking layer 104 and replacing it with a new masking layer. It is to be understood that the replacement of masking layer 104 with masking layer 120 is a preferred aspect of the invention, and the invention encompasses other embodiments (not shown) where masking layer 104 is left in place and unaltered for the processing of FIG. 10.

A dopant 128 is implanted into substrate 102 to form doped regions 130, 132 and 134 over conductively-doped regions 114, 116 and 118, respectively. Dopant 128 will preferably comprise a p-type dopant (such as, for example, boron), and accordingly doped regions 130, 132 and 134 will be p-type doped regions.

An advantage of utilizing a mask 120 which defines larger openings 122, 124 and 126 than the openings 106, 108 and 110 utilized for the processing of FIG. 9, is that p-type doped regions 130, 132 and 134 will extend outwardly beyond lateral peripheries of n-type-doped conductive nodes 114, 116 and 118. In subsequent processing described below, a conductive wiring layer can be formed over regions 130, 132 and 134, and connected to conductively-doped regions 114, 116 and 118 through regions 130, 132 and 134. By having lateral peripheries of regions 130, 132 and 134 extend outwardly beyond lateral peripheries of regions 114, 116 and 118, shorting around regions 130, 132 and 134 can be avoided, and even eliminated.

Figure 11:
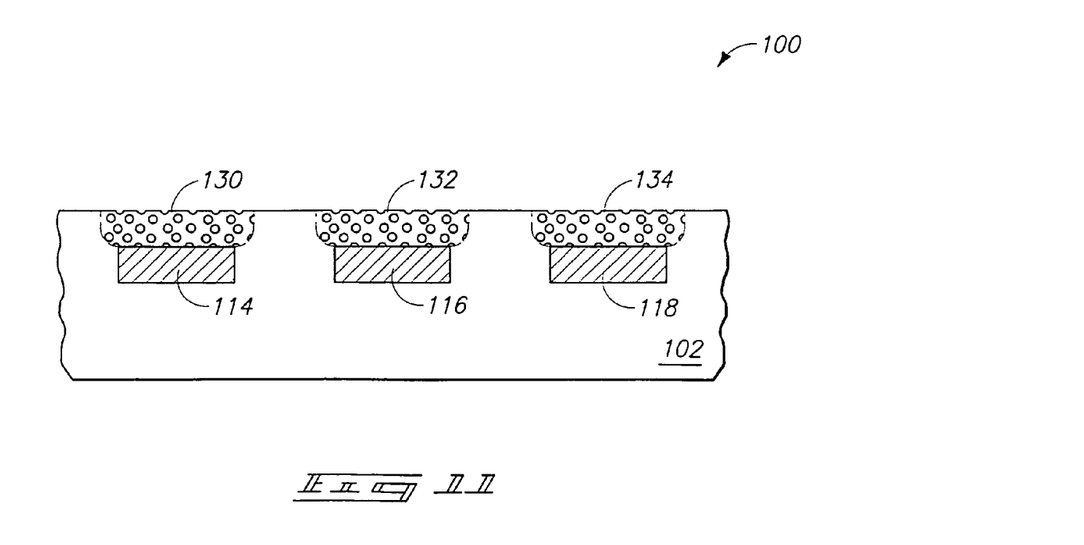
FIG. 11 is a view of the FIG. 8 fragment shown at a processing stage subsequent to that of FIG. 10.

Referring to FIG. 11, mask 120 (FIG. 10) is removed, and p-type doped regions 130, 132 and 134 are converted to porous silicon. Such can be accomplished utilizing, for example, the processing described above with reference to FIG. 4. In the shown embodiment, the porous silicon physically contacts conductively-doped regions 114, 116 and 118.

Figure 12:
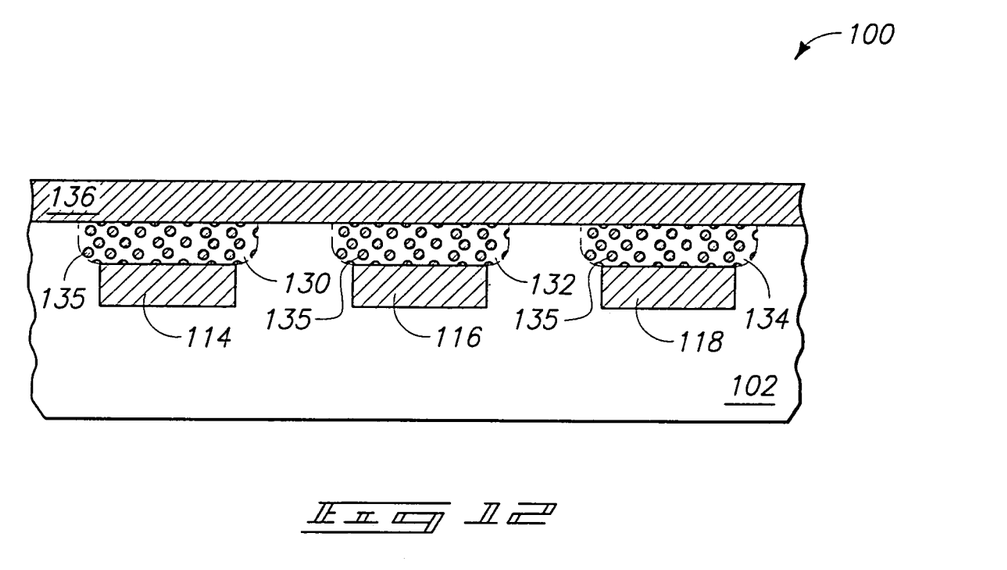
FIG. 12 is a view or the FIG. 8 fragment shown at a processing stage subsequent to that of FIG. 11.

Referring next to FIG. 12, an active molecular switchable memory material 135 is formed within the pores of the porous silicon, and subsequently a conductive line 136 is formed over regions 130, 132 and 134. The structure of FIG. 12 is comparable to the structure described previously with reference to FIG. 6. Accordingly, the structure of FIG. 12 can be considered to comprise memory cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a switchable circuit device, comprising:
providing a semiconductor substrate;
forming an n-type doped silicon-containing material supported by the semiconductor substrate;
forming a p-type doped silicon-containing mass over and in direct contact with the n-typed doped silicon-containing material;
while the mass is over the n-typed doped silicon-containing material, forming pores within the mass to convert the mass to a porous matrix;
providing an active molecular switchable memory material within the pores of the porous matrix; and
forming an electrical connection to the porous matrix having the switchable memory material therein.

2. The method of claim 1 wherein the active molecular switchable memory material substantially completely fills the pores of the porous matrix in a finished construction.

3. The method of claim 1 wherein the active molecular switchable memory material only partially fills the pores of the porous matrix in a finished construction.

4. The method of claim 1 wherein the active molecular switchable memory material comprises two stable states which can be interchanged with one another through reduction and oxidation.

5. The method of claim 1 wherein the active molecular switchable memory material comprises a redox-active catenane.

6. The method of claim 1 wherein the active molecular switchable memory material comprises a redox-active rotaxane.

7. The method of claim 1 wherein the active molecular switchable memory material comprises a redox-active pseudorotaxane.

8. A method of forming a switchable circuit device, comprising
providing a silicon-containing substrate;
forming at least one n-type doped region within the silicon of the silicon-containing substrate and beneath an uppermost surface of the substrate;
forming at least one porous matrix over the at least one n-type doped region;
providing an active molecular switchable memory material within the pores of the at least one porous matrix; and
forming a conductive line over and in electrical contact with the at least one porous matrix having the switchable memory material therein.

9. The method of claim 8 wherein the at least one porous matrix is in physical contact with the at least one n-type doped region.

10. The method of claim 8 wherein the active molecular switchable memory material comprises a redox-active catenane.

11. The method of claim 8 wherein the active molecular switchable memory material comprises a redox-active rotaxane.

12. The method of claim 8 wherein the active molecular switchable memory material comprises a redox-active pseudorotaxane.

13. A method of forming a switchable circuit device, comprising:
forming a mass over a semiconductor substrate;
while the mass is over the substrate, forming pores within the mass to convert the mass to a porous matrix;
providing a mixture of active molecular switchable memory material within a liquid carrier;
providing the mixture within the pores of the porous matrix material;

volatilizing the carrier from within the pores to leave the active molecular switchable memory material remaining within the pores; and forming an electrical connection to the porous matrix having the switchable memory material therein.

14. A method of forming a switchable circuit device, comprising:

providing a semiconductor substrate;

forming a first conductive wiring layer supported by the substrate, the first conductive wiring layer comprising n-type doped silicon;

forming porous silicon over and directly against the conductive wiring layer;

providing an active molecular switchable memory material within pores of the porous silicon; and forming a second conductive wiring layer over the porous silicon and over the active molecular switchable memory material within the pores of the porous silicon.

15. The method of claim 14 wherein the providing the active molecular switchable memory material within the pores of the porous silicon comprises:

forming a mixture of the active molecular switchable memory material within a liquid carrier;

providing the mixture within the pores of the porous silicon; and volatilizing at least some of the carrier from within the pores to leave the active molecular switchable memory material remaining within the pores.

16. A method of forming a semiconductor construction, comprising:

providing a silicon-containing substrate;

forming an electrically insulative material over the silicon-containing substrate;

forming trenches extending into the electrically insulative material;

forming a first conductive wiring layer within the trenches to partially fill the trenches;

forming porous silicon over the first conductive wiring layer within the trenches;

providing an active molecular switchable memory material within pores of the porous silicon;

forming a planarized upper surface extending across an uppermost portion of the porous silicon and across an uppermost portion of the insulative material; and forming a second conductive wiring layer over the planarized upper surface.

17. The method of claim 16 wherein the forming the planarized upper surface occurs after providing the active molecular switchable memory material within pores of the porous silicon.

18. The method of claim 16 wherein the forming the planarized upper surface occurs before providing the active molecular switchable memory material within pores of the porous silicon.

19. The method of claim 16 wherein the first conductive wiring layer defines lines extending primarily along a first direction within the trenches; and wherein the second conductive wiring layer is formed in a shape of a line extending primarily along a second direction substantially perpendicular to the first direction.

20. The method of claim 16 wherein the active molecular switchable memory material comprises a redox-active catenane.

21. The method of claim 16 wherein the active molecular switchable memory material comprises a redox-active rotaxane.

22. The method of claim 16 wherein the active molecular switchable memory material comprises a redox-active pseudorotaxane.

23. The method of claim 16 wherein the first conductive wiring layer comprises conductively doped silicon.

24. The method of claim 16 wherein the first conductive wiring layer comprises silicon conductively doped with n-type dopant.

* * * * *

UNITED STATES PATENT AND TRADEMARK OFFICE
CERTIFICATE OF CORRECTION

PATENT NO. : 7,011,984 B2  
APPLICATION NO. : 11/056483  
DATED : March 14, 2006  
INVENTOR(S) : Terry L. Gilton Page 1 of 1

It is certified that error appears in the above-identified patent and that said Letters Patent is hereby corrected as shown below:

Col. 5, line 42 –
   Replace "and 15 can considered to be along the bottom side of matrix"
   Insert --and 15 can be considered to be along the bottom side of matrix--

Col. 6, line 64 –
   Replace "conductively-doped regions 114, 116 and 1418. Dopant 112"
   Insert --conductively-doped regions 114, 116 and 118. Dopant 112--

Signed and Sealed this

Ninth Day of January, 2007

JON W. DUDAS  
*Director of the United States Patent and Trademark Office*